United States Patent
Kim et al.

(10) Patent No.: US 9,379,254 B2
(45) Date of Patent: Jun. 28, 2016

(54) AMORPHOUS OXIDE SEMICONDUCTOR THIN FILM TRANSISTOR FABRICATION METHOD

(75) Inventors: Cheonhong Kim, San Diego, CA (US); Tallis Young Chang, San Diego, CA (US); John Hyunchul Hong, San Clemente, CA (US)

(73) Assignee: QUALCOMM MEMS TECHNOLOGIES, INC., San Diego, CA (US)

( * ) Notice: Subject to any disclaimer, the term of this patent is extended or adjusted under 35 U.S.C. 154(b) by 1045 days.

(21) Appl. No.: 13/299,780

(22) Filed: Nov. 18, 2011

(65) Prior Publication Data

US 2013/0127694 A1 May 23, 2013

(51) Int. Cl.
*H01L 29/10* (2006.01)
*H01L 29/786* (2006.01)
*H01L 29/66* (2006.01)

(52) U.S. Cl.
CPC .... *H01L 29/78693* (2013.01); *H01L 29/66969* (2013.01); *H01L 29/78618* (2013.01)

(58) Field of Classification Search
CPC .......... H01L 2251/105; H01L 29/66742; H01L 29/78618; H01L 29/78693; H01L 51/0014; H01L 51/56; H01L 29/66969
USPC .............................. 257/43; 438/104
See application file for complete search history.

(56) References Cited

U.S. PATENT DOCUMENTS

| | | | |
|---|---|---|---|
| 5,576,556 A * | 11/1996 | Takemura et al. | 257/69 |
| 7,329,913 B2 | 2/2008 | Brask et al. | |
| 7,589,382 B2 | 9/2009 | Suzawa et al. | |
| 7,660,028 B2 | 2/2010 | Lan | |
| 8,797,303 B2 | 8/2014 | Kim et al. | |
| 2002/0126108 A1 | 9/2002 | Koyama et al. | |
| 2003/0096463 A1 | 5/2003 | Nishio | |
| 2006/0046354 A1 | 3/2006 | Kreipl | |
| 2006/0066595 A1 * | 3/2006 | Sampsell et al. | 345/204 |
| 2007/0241327 A1 | 10/2007 | Kim et al. | |
| 2008/0179587 A1 * | 7/2008 | Namkoong et al. | 257/13 |
| 2008/0203387 A1 | 8/2008 | Kang et al. | |
| 2009/0001363 A1 | 1/2009 | Park et al. | |

(Continued)

FOREIGN PATENT DOCUMENTS

| JP | 2002016082 A | 1/2002 |
|---|---|---|
| JP | 2002091332 A | 3/2002 |

(Continued)

OTHER PUBLICATIONS

International Search Report and Written Opinion—PCT/US2012/065680—ISA/EPO—Feb. 5, 2013.

(Continued)

*Primary Examiner* — Duy T Nguyen

(74) *Attorney, Agent, or Firm* — Weaver Austin Villeneuve & Sampson LLP

(57) ABSTRACT

This disclosure provides systems, methods and apparatus for fabricating thin film transistor (TFT) devices. In one aspect, a substrate having a source area, a drain area, and a channel area is provided. Metal cations are implanted in the oxide semiconductor layer overlying the source area and the drain area of the substrate. The metal cation implantation forms a doped n-type oxide semiconductor in the oxide semiconductor layer overlying the source area and the drain area of the substrate.

14 Claims, 15 Drawing Sheets

(56) References Cited

U.S. PATENT DOCUMENTS

| | | |
|---|---|---|
| 2009/0096002 A1 | 4/2009 | Yu et al. |
| 2009/0283763 A1 | 11/2009 | Park et al. |
| 2010/0065838 A1 | 3/2010 | Yamazaki et al. |
| 2010/0148169 A1 | 6/2010 | Kim et al. |
| 2010/0213460 A1 | 8/2010 | Kondo et al. |
| 2010/0230814 A1 | 9/2010 | Marks et al. |
| 2010/0330763 A1 | 12/2010 | Freeman et al. |
| 2011/0003430 A1 | 1/2011 | Yamazaki et al. |
| 2011/0136301 A1 | 6/2011 | Yamazaki et al. |
| 2011/0147738 A1 | 6/2011 | Yamazaki et al. |
| 2011/0168993 A1* | 7/2011 | Jeon et al. .................. 257/43 |
| 2011/0240998 A1 | 10/2011 | Morosawa et al. |
| 2012/0001167 A1 | 1/2012 | Morosawa |
| 2012/0242627 A1 | 9/2012 | Kim et al. |
| 2013/0009149 A1 | 1/2013 | Endo et al. |

FOREIGN PATENT DOCUMENTS

| | | | |
|---|---|---|---|
| JP | 2003050405 A | 2/2003 | |
| JP | 2005175121 A | 6/2005 | |
| JP | 2007519256 A | 7/2007 | |
| JP | 2007284342 A | 11/2007 | |
| JP | 2007318112 A | 12/2007 | |
| JP | 2008166724 A | 7/2008 | |
| JP | 2008205469 A | 9/2008 | |
| JP | 2009278115 A | 11/2009 | |
| JP | 2010219094 A | 9/2010 | |
| JP | 2011146694 A | 7/2011 | |
| JP | 2011228622 A | 11/2011 | |
| JP | 2012015436 A | 1/2012 | |
| JP | 2013038396 A | 2/2013 | |
| TW | 200824045 A | 6/2008 | |
| TW | I298202 B | 6/2008 | |
| TW | 201005953 A | 2/2010 | |
| TW | 201044581 A | 12/2010 | |
| WO | WO-2005074038 A1 | 8/2005 | |
| WO | WO-2009120558 A1 | 10/2009 | |

OTHER PUBLICATIONS

Office Action dated May 16, 2013, issued in U.S. Appl. No. 13/052,446.

Notice of Allowance dated Sep. 3, 2013, issued in U.S. Appl. No. 13/052,446.

International Search Report and Written Opinion—PCT/US2012/028815—ISA/EPO—Jun. 13, 2012.

International Preliminary Report on Patentability—PCT/US2012/028815—The International Bureau of WIPO Geneva, Switzerland, Jul. 12, 2013.

Taiwan Search Report—TW101109571—TIPO—Mar. 4, 2015.

Second Written Opinion from International Patent Application No. PCT/US2012/028815, dated Apr. 23, 2013, pp. 6.

Japanese Notice of Reasons for Rejection dated May 25, 2015, issued in Application No. 2014-542522.

* cited by examiner

| | Common Voltages | | | | |
|---|---|---|---|---|---|
| Segment Voltages | $VC_{ADD\_H}$ | $VC_{HOLD\_H}$ | $VC_{REL}$ | $VC_{HOLD\_L}$ | $VC_{ADD\_L}$ |
| $VS_H$ | Stable | Stable | Relax | Stable | Actuate |
| $VS_L$ | Actuate | Stable | Relax | Stable | Stable |

AMORPHOUS OXIDE SEMICONDUCTOR THIN FILM TRANSISTOR FABRICATION METHOD

TECHNICAL FIELD

This disclosure relates generally to thin film transistor devices and more particularly to fabrication methods for thin film transistor devices.

DESCRIPTION OF THE RELATED TECHNOLOGY

Electromechanical systems (EMS) include devices having electrical and mechanical elements, actuators, transducers, sensors, optical components (such as mirrors and optical film layers) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography and/or other micromachining processes that etch away parts of substrates and/or deposited material layers, or that add layers to form electrical and electromechanical devices.

One type of EMS device is called an interferometric modulator (IMOD). As used herein, the term interferometric modulator or interferometric light modulator refers to a device that selectively absorbs and/or reflects light using the principles of optical interference. In some implementations, an IMOD may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the IMOD. IMOD devices have a wide range of applications, and are anticipated to be used in improving existing products and creating new products, especially those with display capabilities.

Hardware and data processing apparatus may be associated with EMS devices. Such hardware and data processing apparatus may include a thin film transistor (TFT) device. A TFT device is a field-effect transistor that includes a source region, a drain region, and a channel region in a semiconductor material.

SUMMARY

The systems, methods and devices of the disclosure each have several innovative aspects, no single one of which is solely responsible for the desirable attributes disclosed herein.

One innovative aspect of the subject matter described in this disclosure can be implemented in a substrate having a source area, a drain area, and a channel area. Metal cations are implanted in an oxide semiconductor layer overlying the source area and the drain area of the substrate. The metal cation implantation forms a doped n-type oxide semiconductor in the oxide semiconductor layer overlying the source area and the drain area of the substrate.

In some implementations, the oxide semiconductor layer can include one or more of indium (In), gallium (Ga), zinc (Zn), hafnium (Hf), and tin (Sn). The metal cations can include cations of a constituent metal of the oxide semiconductor layer, such as indium cations ($In^+$), gallium cations ($Ga^+$), zinc cations ($Zn^+$), hafnium cations ($Hf^+$), and tin cations ($Sn^+$).

Another innovative aspect of the subject matter described in this disclosure can be implemented in a method of forming a doped n-type oxide semiconductor. The method can include providing a substrate, the surface of which can include source area, a drain area, and a channel area. The substrate also can include an oxide semiconductor layer on the surface of the substrate, and a mask on the oxide semiconductor layer overlying the channel area of the substrate. The method can include implanting metal cations in the oxide semiconductor layer overlying the source area and the drain area of the substrate to form doped n-type oxide semiconductor layers. In some implementations, the oxide semiconductor layer can include one or more of In, Ga, Zn, Hf, and Sn. The metal cations can include cations of a constituent metal of the oxide semiconductor layer, such as $In^+$, $Ga^+$, $Zn^+$, $Hf^+$, and $Sn^+$. In some implementations, the metal cations can be implanted to a concentration in the oxide semiconductor layer overlying the source area and the drain area of the substrate of greater than about $10^{19}$ atoms/cm$^3$.

The method can further include forming a first dielectric layer on the oxide semiconductor layer overlying the channel area and forming a first metal layer on the first dielectric layer. In some implementations, the mask can include the first metal layer. The first metal layer can be a metal gate for a thin film transistor (TFT), for example.

The method can further include implanting first ions in at least a region of the oxide semiconductor layer overlying the channel area. The first ions can be implanted using a dose of at between about $10^{12}$ atoms/cm$^2$ and $10^{20}$ atoms/cm$^2$, for example.

Another innovative aspect of the subject matter described in this disclosure can be implemented in an apparatus including doped n-type oxide semiconductor layers. In some implementations, the apparatus can include a substrate, an oxide semiconductor layer on a surface of the substrate, with the oxide semiconductor layer including a channel region, a source region, and a drain region. The source region and the drain region of the oxide semiconductor layer can be doped n-type oxide semiconductor layers implanted with metal cations. In some implementations, the apparatus can further include a first dielectric layer on the channel region of the oxide semiconductor layer; and a first metal layer on the first dielectric layer.

In some implementations, the doped n-type oxide semiconductor layers can be implanted with metal cations to a concentration of greater than about $10^{19}$ atoms/cm$^3$. The oxide semiconductor layer can include one or more of indium (In), gallium (Ga), zinc (Zn), hafnium (Hf), and tin (Sn). The metal cations can include cations of a constituent metal of the oxide semiconductor layer, such as indium cations ($In^+$), gallium cations ($Ga^+$), zinc cations ($Zn^+$), hafnium cations ($Hf^+$), and tin cations ($Sn^+$).

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects and advantages will become apparent from the description, the drawings and the claims. Note that the relative dimensions of the following figures may not be drawn to scale.

BRIEF DESCRIPTION OF THE FIGURES

Like reference numbers and designations in the various drawings indicate like elements.

DETAILED DESCRIPTION

Figure 1:
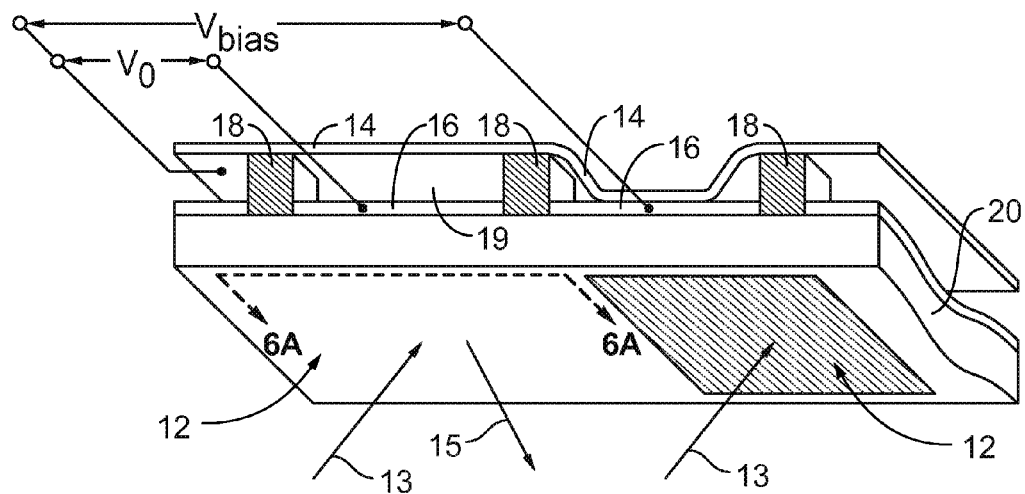
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

Some implementations described herein relate to thin film transistor (TFT) devices with doped or heavily doped n-type oxide semiconductor (i.e., an n+ semiconductor) source and drain regions and methods of their fabrication. A dopant dose for heavily doped source and drain regions may be greater than about $10^{18}$ atoms/cm$^2$ or greater than about $10^{19}$ atoms/cm$^2$, such as greater than about $10^{20}$ atoms/cm$^2$. In some implementations, such dopant concentrations may yield a good ohmic contact in the source and the drain regions. In some implementations, metal cations are implanted in an amorphous oxide semiconductor layer. In some implementations, the oxide semiconductor is an amorphous oxide semiconductor, including indium (In)-containing, zinc (Zn)-containing, tin (Sn)-containing, hafnium (Hf)-containing, or gallium (Ga)-containing oxide semiconductors. The metal cation implantation can form heavily doped n-type oxide semiconductor source and drain regions of a TFT device. In some implementations, the implanted cations are cations of one or more constituent metals of the oxide semiconductor layer. Examples of metal cations include cations of In, Zn, Sn, Hf and Ga.

In some implementations, a TFT device can be fabricated on a substrate. The substrate can have a surface including a source area, a drain area, and a channel area, with the channel area being between the source area and the drain area. An oxide semiconductor layer can be formed on the surface of the substrate. A mask can be formed over a region of the oxide semiconductor layer that overlies the channel area. In some implementations, the mask can include a dielectric layer configured to act as a gate insulator and a first metal layer configured to act as a gate of the TFT device. Metal cations can be implanted in the unmasked regions of the oxide semiconductor layer, including in regions of the oxide semiconductor layer that overlie the source and drain areas. An n-type oxide semiconductor is formed in the oxide semiconductor layer overlying the source and drain areas. The n-type oxide semiconductor can be formed in this layer due to the lack of oxygen which reacts, i.e., binds, with extra metal cation ions.

The n-type oxide semiconductor overlying the source area of the substrate can form the source of the TFT device. The n-type oxide semiconductor overlying the drain area of the substrate can form the drain of the TFT device. The oxide semiconductor layer overlying the channel region of the substrate can form the channel of the TFT device. In some implementations, the channel region is not affected by the implantation of metal cations due to the gate metal mask. Further operations then can be performed to complete the fabrication of the TFT device.

Particular implementations of the subject matter described in this disclosure can be implemented to realize one or more of the following potential advantages. Implementations of the methods may be used to form a top gate TFT device incorporating an oxide semiconductor with heavily doped n-type regions. Heavily doped n-type regions in the source and drain area of the TFT device reduce contact resistance by lowering the electric barrier in the contact of a heavily doped n-type region of the oxide semiconductor and a contact material; a high parasitic contact resistance can degrade TFT device operation. Other methods of forming heavily doped n-type regions of an oxide semiconductor, such as argon (Ar) plasma treatments and hydrogen-containing plasma treatments, may not have good doping efficiency or long term reliability. The methods disclosed herein provide a reliable and robust process for forming heavily doped n-type regions of an oxide semiconductor. Implementations of the methods also may be used to control of the carrier concentration in the oxide semiconductor layer such that the threshold voltage can be controlled.

Further, implementations of the methods may be used to form a self-aligned top gate TFT device in which the gate region of the TFT is used as a mask. Self-aligning fabrication processes help to ensure that the gate is in the proper position relative to the source and drain regions of the oxide semiconductor. Self-aligning fabrication processes also do not use lithographic patterning processes in aligning the gate, source region, and drain region of a TFT device, simplifying the process and greatly improving the yield. The yield refers to the percentage of a number of TFT devices on a substrate that function properly. The self-aligned TFT devices can be implemented to have no overlap between the gate and the source and/or drain regions and minimal parasitic capacitances between the gate and source region ($C_{GS}$) and/or between the gate and drain region ($C_{GD}$). Reducing the parasitic capacitance can improve the speed performance of circuits and reduce the power consumption.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity. One way of changing the optical resonant cavity is by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, absorbing and/or destructively interfering light within the visible range. In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. Although not illustrated in detail, it will be understood by a person having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, such as chromium (Cr), semiconductors and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and electrical conductor, while different, electrically more conductive layers or portions (e.g., of the optical stack 16 or of other structures of the IMOD) can serve to bus signals between IMOD pixels. The optical stack 16 also can include one or more insulating or dielectric layers covering one or more conductive layers or an electrically conductive/optically absorptive layer.

In some implementations, the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, a voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
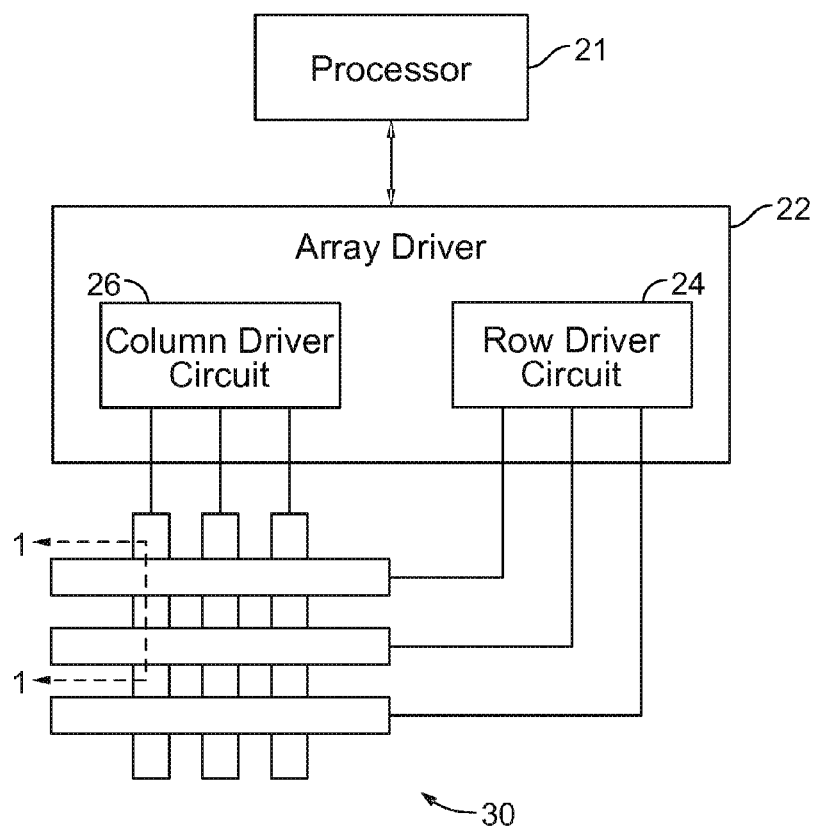
FIG. 2 shows an example of a system block diagram illustrating an electronic device incorporating a 3×3 IMOD display.

FIG. 2 shows an example of a system block diagram illustrating an electronic device incorporating a 3×3 IMOD display. The electronic device includes a processor 21 that may be configured to execute one or more software modules. In addition to executing an operating system, the processor 21 may be configured to execute one or more software applications, including a web browser, a telephone application, an email program or any other software application.

The processor 21 can be configured to communicate with an array driver 22. The array driver 22 can include a row driver circuit 24 and a column driver circuit 26 that provide signals to, for example, a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
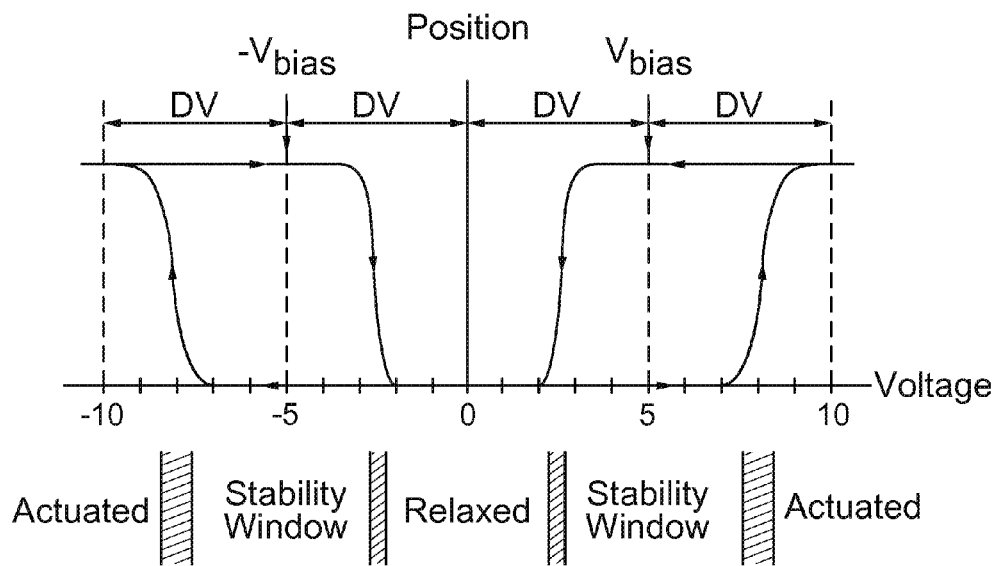
FIG. 3 shows an example of a diagram illustrating movable reflective layer position versus applied voltage for the IMOD of FIG. 1.
FIG. 4 shows an example of a table illustrating various states of an IMOD when various common and segment voltages are applied.

FIG. 3 shows an example of a diagram illustrating movable reflective layer position versus applied voltage for the IMOD of FIG. 1. For MEMS interferometric modulators, the row/column (i.e., common/segment) write procedure may take advantage of a hysteresis property of these devices as illustrated in FIG. 3. An interferometric modulator may use, in one example implementation, about a 10-volt potential difference to cause the movable reflective layer, or mirror, to change from the relaxed state to the actuated state. When the voltage is reduced from that value, the movable reflective layer maintains its state as the voltage drops back below, in this example, 10 volts, however, the movable reflective layer does not relax completely until the voltage drops below 2 volts. Thus, a range of voltage, approximately 3 to 7 volts, in this example, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about, in this example, 10 volts, and pixels that are to be relaxed are exposed to a voltage difference of near zero volts. After addressing, the pixels can be exposed to a steady state or bias voltage difference of approximately 5 volts in this example, such that they remain in the previous strobing state. In this example, after being addressed, each pixel sees a potential difference within the "stability window" of about 3-7 volts. This hysteresis property feature enables the pixel design, such as that illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an IMOD when various common and segment voltages are applied. As will be understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator pixels (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which produce the same polarity potential difference across the modulators. In some other implementations, signals can be used which alternate the polarity of the potential difference of the modulators from time to time. Alternation of the polarity across the modulators (that is, alternation of the polarity of write procedures) may reduce or inhibit charge accumulation which could occur after repeated write operations of a single polarity.

Figure 5A:
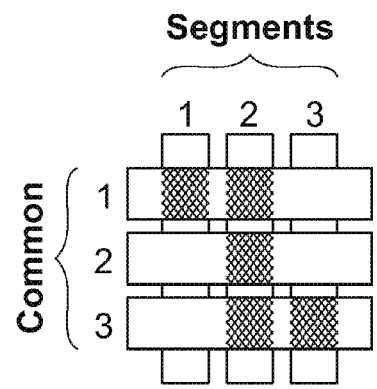
FIG. 5A shows an example of a diagram illustrating a frame of display data in the 3×3 IMOD display of FIG. 2.
Figure 5B:
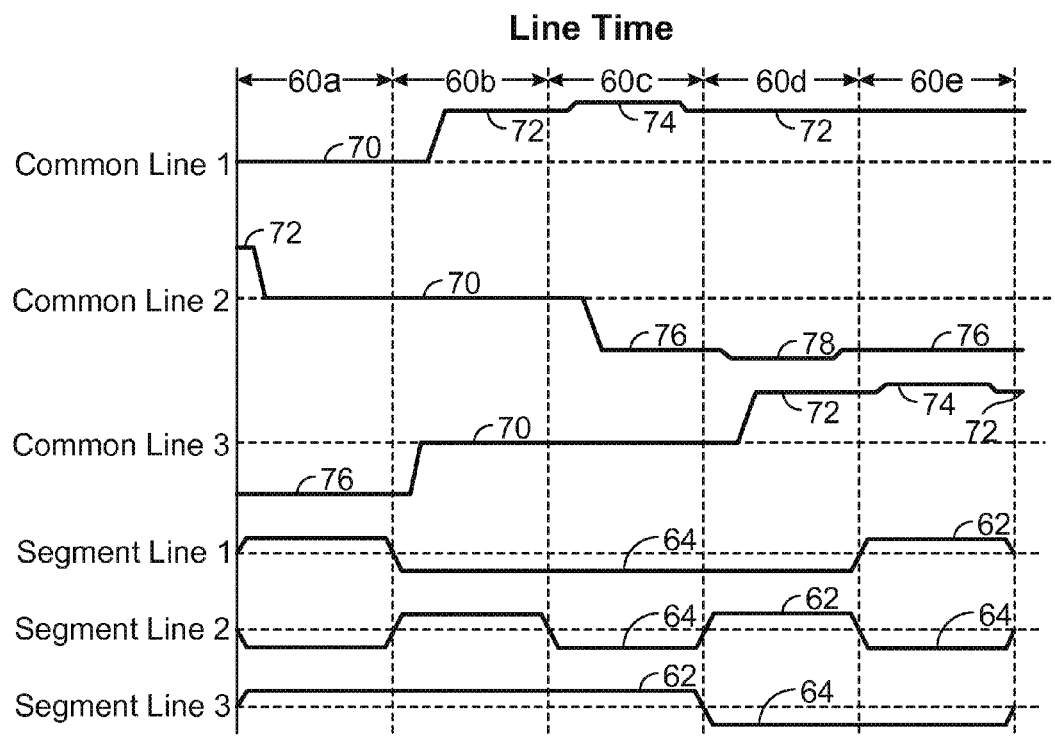
FIG. 5B shows an example of a timing diagram for common and segment signals that may be used to write the frame of display data illustrated in FIG. 5A.

FIG. 5A shows an example of a diagram illustrating a frame of display data in the 3×3 IMOD display of FIG. 2. FIG. 5B shows an example of a timing diagram for common and segment signals that may be used to write the frame of display data illustrated in FIG. 5A. The signals can be applied to a 3×3 array, similar to the array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, for example, a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
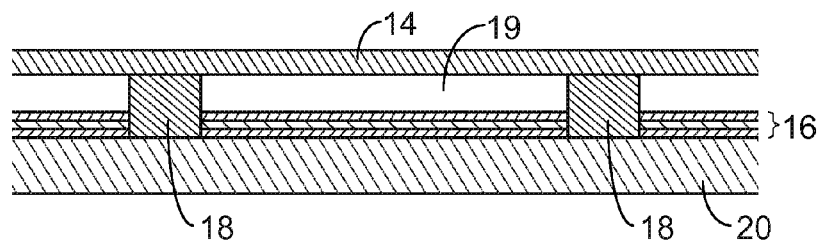
FIG. 6A shows an example of a partial cross-section of the IMOD display of FIG. 1.
Figure 6B:
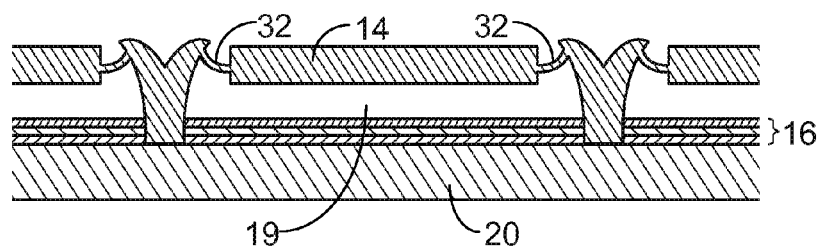
FIGS. 6B-6E show examples of cross-sections of varying implementations of IMODs.
Figure 6C:
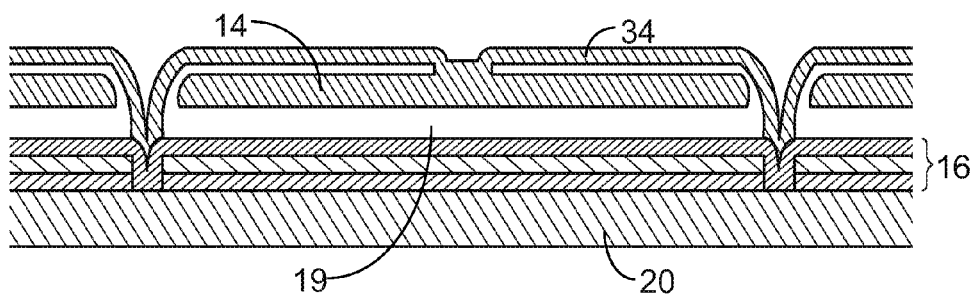

The details of the structure of interferometric modulators that operate in accordance with the principles set forth above may vary widely. For example, FIGS. 6A-6E show examples of cross-sections of varying implementations of IMODs, including the movable reflective layer 14 and its supporting structures. FIG. 6A shows an example of a partial cross-section of the IMOD display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
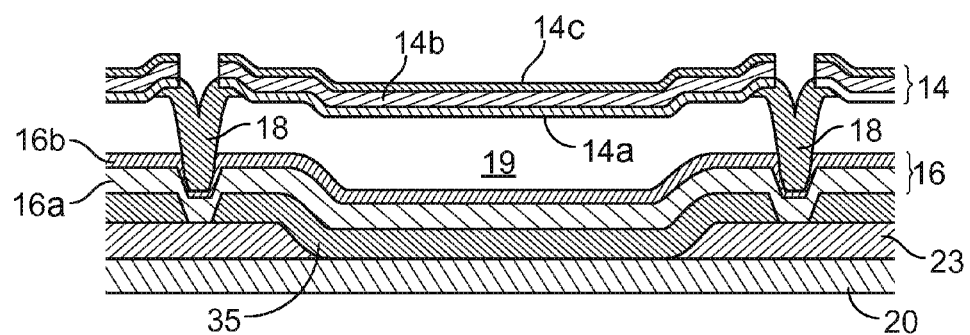

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, for example, an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (such as between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a $SiO_2$ layer and an aluminum alloy that serves as a reflector and a bussing layer, with a thickness in the range of about 30-80 Å, 500-1000 Å and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
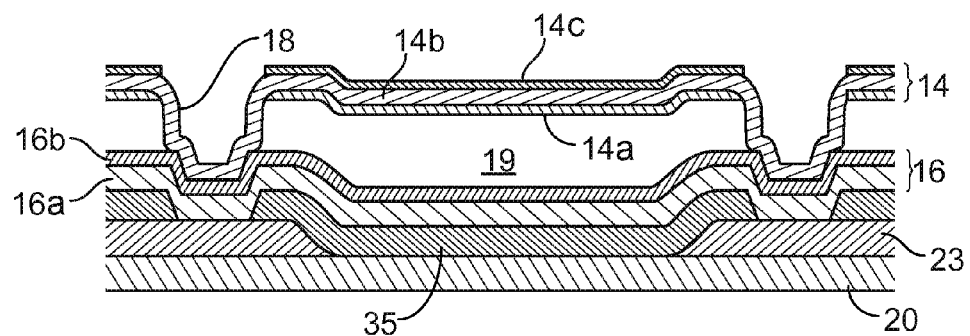

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer. In some implementations, the optical absorber 16a is an order of magnitude (ten times or more) thinner than the movable reflective layer 14. In some implementations, the optical absorber 16a is thinner than the reflective sub-layer 14a.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as patterning.

Figure 7:
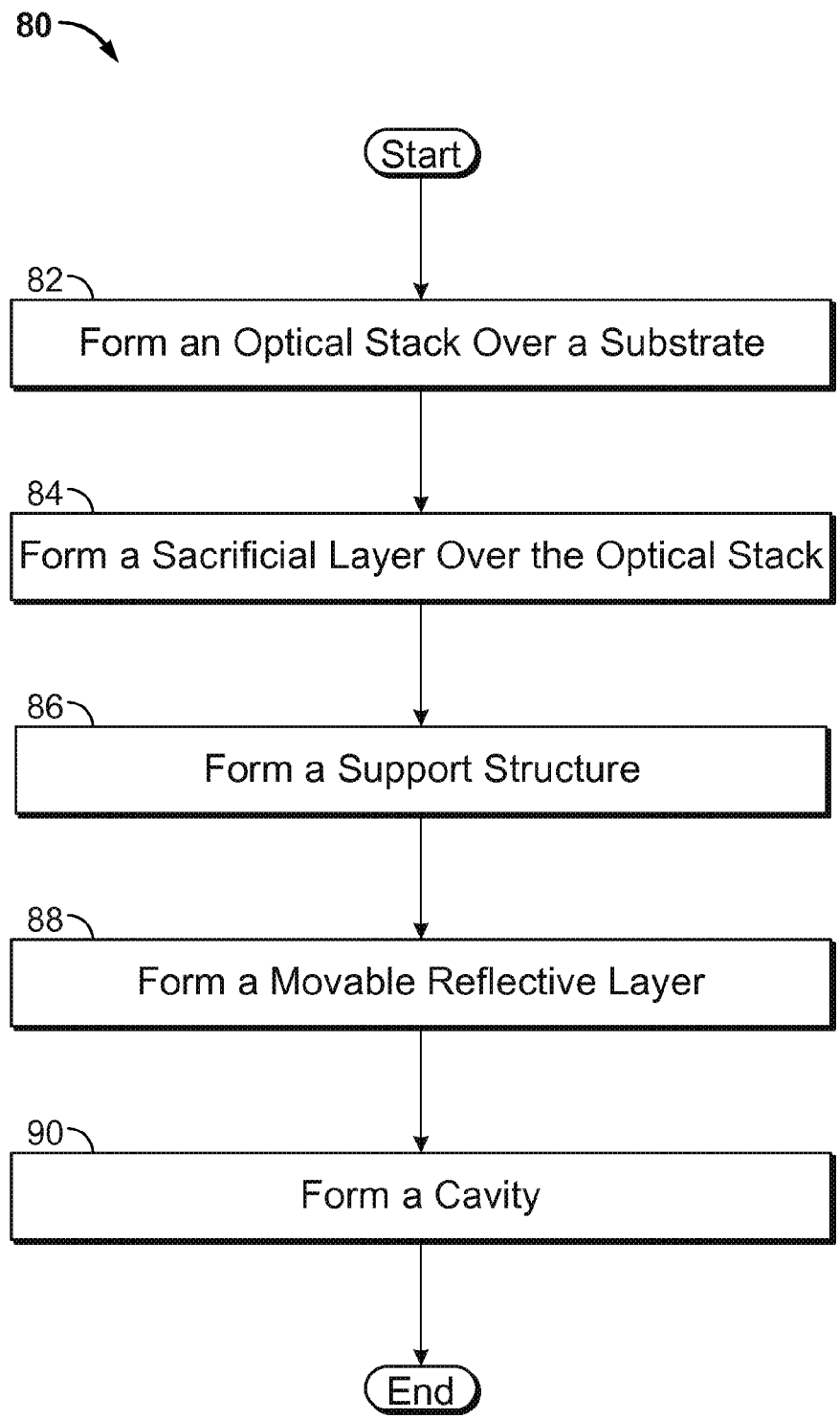
FIG. 7 shows an example of a flow diagram illustrating a manufacturing process for an IMOD.
Figure 8A:
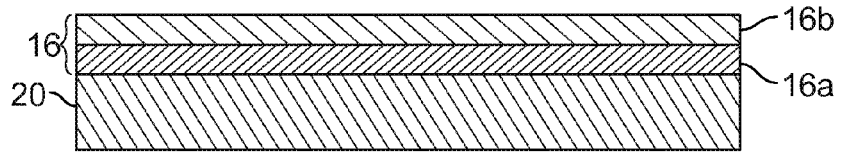
FIGS. 8A-8E show examples of cross-sectional schematic illustrations of various stages in a method of making an IMOD.

FIG. 7 shows an example of a flow diagram illustrating a manufacturing process 80 for an IMOD, and FIGS. 8A-8E show examples of cross-sectional schematic illustrations of corresponding stages of such a manufacturing process 80. In some implementations, the manufacturing process 80 can be implemented to manufacture an electromechanical systems (EMS) device such as interferometric modulators of the general type illustrated in FIGS. 1 and 6. The manufacture of an EMS device also can include other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, such as cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and electrically conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display. It is noted that FIGS. 8A-8E may not be drawn to scale. For example, in some implementations, one of the sub-layers of the optical stack, the optically absorptive layer, may be very thin, although the sub-layers 16a, 16b are shown somewhat thick in FIGS. 8A-8E.

Figure 8B:
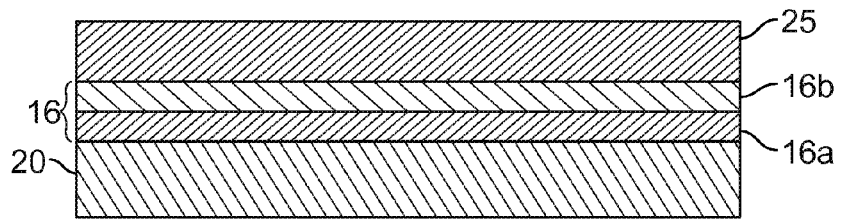

The process 80 continues at block 84 with the formation of a sacrificial layer 25 over the optical stack 16. The sacrificial layer 25 is later removed (see block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (a-Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, which includes many different techniques, such as sputtering), plasma-enhanced chemical vapor deposition (PECVD), thermal chemical vapor deposition (thermal CVD) or spin-coating.

Figure 8C:
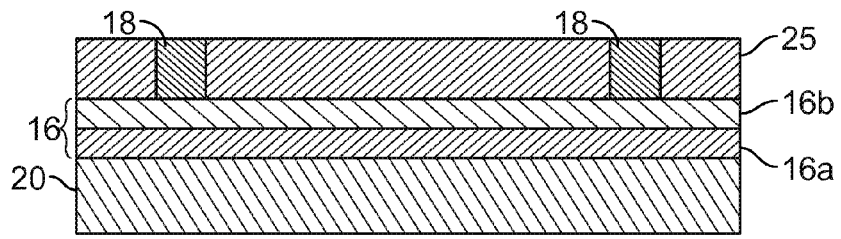

The process 80 continues at block 86 with the formation of a support structure such as post 18, illustrated in FIGS. 1, 6 and 8C. The formation of the post 18 may include patterning the sacrificial layer 25 to form a support structure aperture, then depositing a material (such as a polymer or an inorganic material such as silicon oxide) into the aperture to form the post 18, using a deposition method such as PVD, PECVD, thermal CVD or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
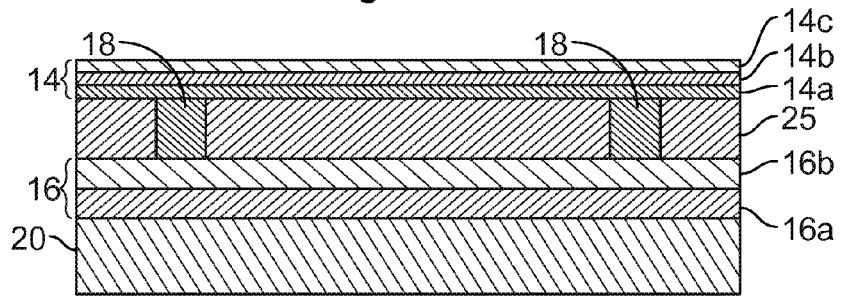
Figure 8E:
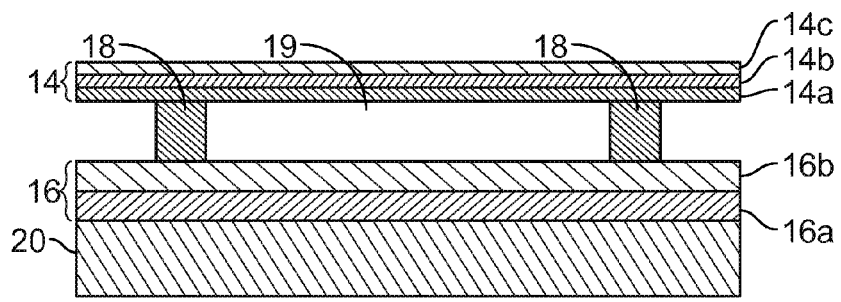

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps including, for example, reflective layer (such as aluminum, aluminum alloy, or other reflective layer) deposition, along with one or more patterning, masking and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, such as cavity 19 illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, by exposing the sacrificial layer 25 to a gaseous or vaporous etchant, such as vapors derived from solid $XeF_2$, for a period of time that is effective to remove the desired amount of material. The sacrificial material is typically selectively removed relative to the structures surrounding the cavity 19. Other etching methods, such as wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Figure 9:
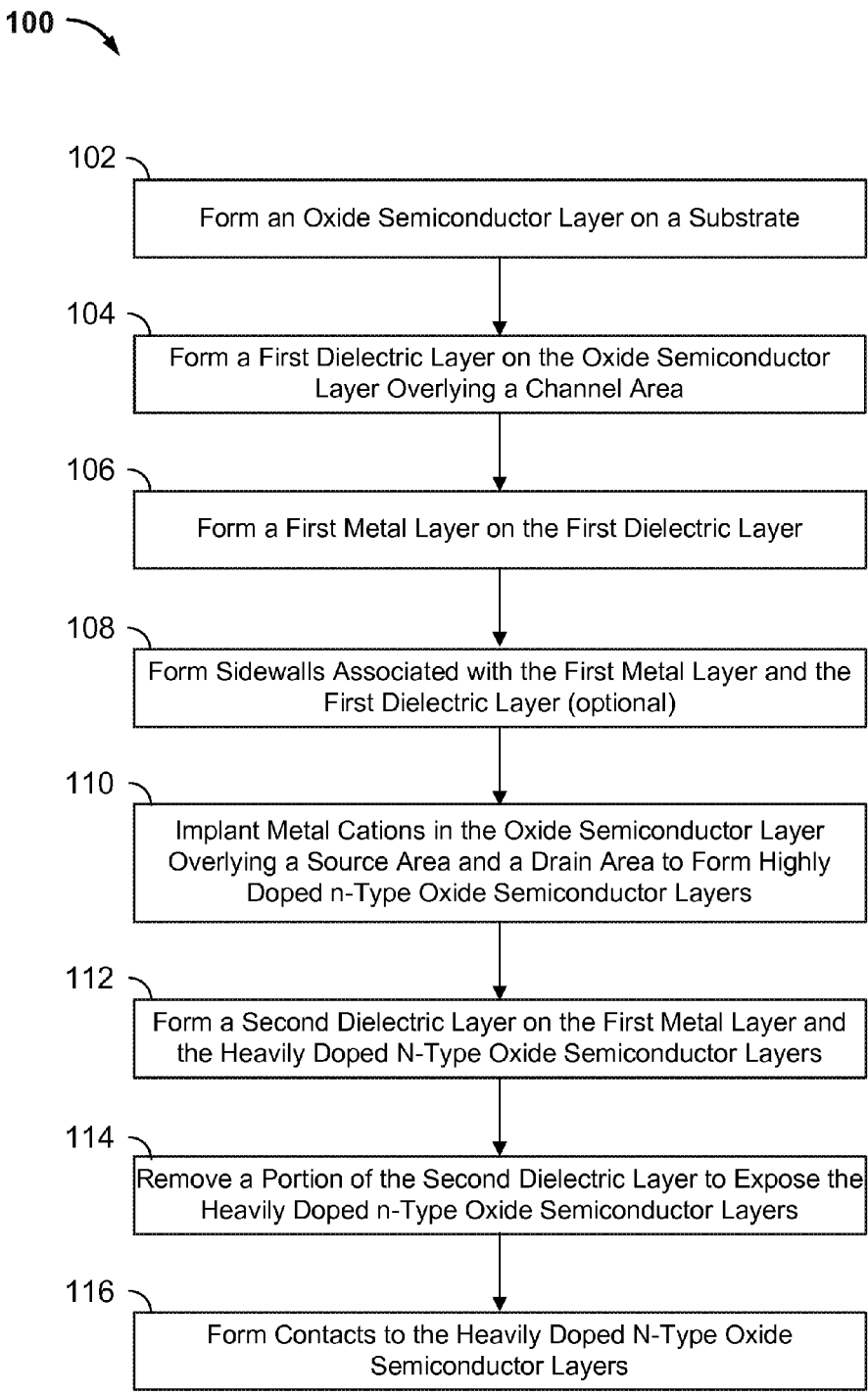
FIG. 9 shows an example of a flow diagram illustrating a manufacturing process for a thin film transistor (TFT) device.

IMODs and other EMS devices can be implemented with a thin film transistor (TFT) device or devices. FIG. 9 shows an example of a flow diagram illustrating a manufacturing process for a thin film transistor (TFT) device. FIGS. 10A-10D show examples of the TFT device as described in FIG. 9 at various stages in the process 100. Additional examples of processes for fabricating a TFT device are described below with reference to FIGS. 12 and 13.

Turning first to FIG. 9, at block 102 of the process 100, an oxide semiconductor layer is formed on a substrate. The substrate may include different substrate materials, including transparent materials, non-transparent materials, flexible materials, rigid materials, or combination of these. In some implementations, the substrate is silicon, silicon-on-insulator (SOI), a glass (such as a display glass or a borosilicate glass), a flexible plastic, or a metal foil. In some implementations, the substrate on which the TFT device is fabricated has dimensions of a few microns to hundreds of microns. In some other implementations, the substrate on which the TFT device is fabricated has dimensions of at least about 1 meter by 1 meter or a few meters to tens of kilometers. For example, a flexible substrate may be stored in a rolled form and have dimensions of a few meters wide and tens of kilometers long.

The substrate includes a source area, a channel area, and a drain area. These are areas over which the source region, the channel region, and the drain region of the TFT device will be formed. The channel region of the TFT device is between the source region and the drain region, and connects these regions. It should be noted that in some implementations, these regions are defined at least in part by the formation of the gate of the TFT, with the area of the substrate underlying. Furthermore, these regions may be aligned with the gate defined as the channel area of the substrate.

In some implementations, a surface of the substrate on which the TFT device is fabricated includes a buffer layer. The buffer layer may serve as an insulation surface. In some implementations, the buffer layer is an oxide, such as silicon oxide ($SiO_2$) or aluminum oxide ($Al_2O_3$). In some implementations, the buffer layer is about 100 to 1000 nanometers (nm) thick.

The oxide semiconductor layer is formed over at least the source area, the channel area, and the drain area of the substrate and will form the channel region of the TFT device as well as heavily doped n-type oxide semiconductor source and drain regions of the TFT device. The oxide semiconductor layer may be any number of different oxide semiconductor materials. In some implementations, the oxide semiconductor is an amorphous oxide semiconductor, including In-containing, Zn-containing, Sn-containing, Hf-containing, or Ga-containing oxide semiconductors. Specific examples of amorphous oxide semiconductors include indium gallium zinc oxide (InGaZnO), indium zinc oxide (InZnO), indium hafnium zinc oxide (InHfZnO), indium tin zinc oxide (InSnZnO), tin zinc oxide (SnZnO), indium tin oxide (InSnO), gallium zinc oxide (GaZnO), and zinc oxide (ZnO). In some implementations, an oxide semiconductor layer is formed with a physical vapor deposition (PVD) process. PVD processes include pulsed laser deposition (PLD), sputter deposition, electron beam physical vapor deposition (e-beam PVD), and evaporative deposition, etc. In some implementations, the oxide semiconductor layer is about 10 nm to 100 nm thick.

At block 104, a first dielectric layer is formed on the oxide semiconductor layer such that the first dielectric layer is on at least the portion of the oxide semiconductor layer overlying the channel area of the substrate. In some implementations, the first dielectric layer is formed only on the portion of the oxide semiconductor layer overlying the channel area of the substrate. The first dielectric layer may be any number of different dielectric materials. In some implementations, the first dielectric layer is silicon dioxide ($SiO_2$), aluminum oxide ($Al_2O_3$), hafnium oxide ($HfO_2$), titanium oxide ($TiO_2$), silicon oxynitride (SiON), or silicon nitride (SiN). In some other implementations, the first dielectric layer includes two or more layers of different dielectric materials arranged in a stacked structure. The first dielectric layer may be formed using deposition processes, including PVD processes, chemical vapor deposition (CVD) processes including plasma-enhanced chemical vapor deposition (PECVD) processes, and atomic layer deposition (ALD) processes. In some implementations, the first dielectric layer is about 50 nm to 500 nm thick. The first dielectric layer may serve as a gate insulator in the TFT device.

At block 106, a first metal layer is formed on the first dielectric layer. The first metal layer may be any number of different metals, including aluminum (Al), copper (Cu), molybdenum (Mo), tantalum (Ta), chromium (Cr), neodymium (Nd), tungsten (W), titanium (Ti), and an alloy containing any of these elements. In some implementations, the first metal layer includes two or more layers of different metals arranged in a stacked structure. The first metal layer may be formed using deposition processes, including PVD processes, CVD processes, or ALD processes. As noted above, PVD processes include PLD and sputter deposition. The first metal layer may serve as a gate in the TFT device.

In some implementations, the first dielectric layer and/or the first metal layer is formed on the oxide semiconductor layer overlying the source area, the channel area, and the drain area of the substrate. In these implementations, the first dielectric layer and/or the first metal may be patterned with photoresists. The first metal layer or both of the first metal layer and the first dielectric layer may then be etched. These operations may remove the portions of the first dielectric layer and the first metal layer overlying the source area and the drain area of the substrate.

Figure 10A:
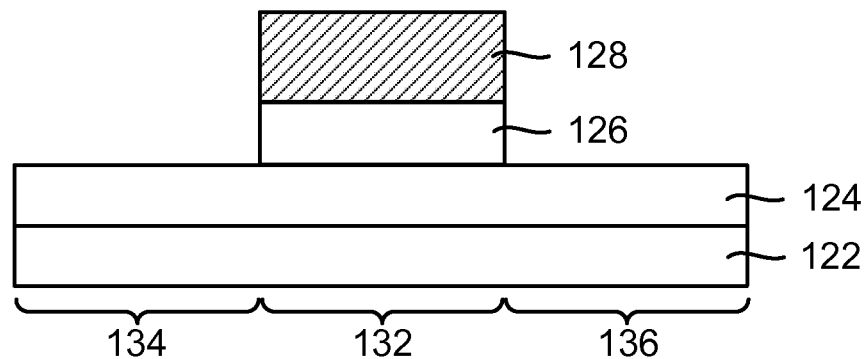
FIGS. 10A-10D show examples of the TFT device as described in FIG. 9 at various stages in the process.

FIG. 10A shows an example of the TFT device at this point (e.g., up to the block 106) in the process 100. The TFT device includes a substrate 122, an oxide semiconductor layer 124, a first dielectric layer 126, and a first metal layer 128. The substrate includes a source area 134, a channel area 132, and a drain area 136. The channel area 132 of the substrate is aligned with the first dielectric layer 126 and the first metal layer 128.

Returning to FIG. 9, at block 108 dielectric sidewalls, also known as dielectric spacers, associated with the first metal layer and the first dielectric layer are formed. The dielectric sidewalls may be formed with any number of different dielectric materials. In some implementations, the dielectric sidewalls are the same dielectric material as the first dielectric layer, such as $SiO_2$, $Al_2O_3$, $HfO_2$, $TiO_2$, SiON, or SiN.

In some implementations, the dielectric sidewalls can be formed by depositing the dielectric sidewall material on the oxide semiconductor layer overlying the source area and the drain area of the substrate and on the first metal layer. An anisotropic etch process may be used to remove the dielectric sidewall material from the first metal layer and portions of the oxide semiconductor layer overlying the source area and the drain area of the substrate. In some implementations, the anisotropic etch process is a reactive ion etch (RIE) process in which a radio frequency (RF) bias is applied to the substrate to create directional electric fields near the substrate. The directional electric fields near the substrate yield dielectric sidewalls having sloped profiles in some implementations.

Portions of the oxide semiconductor layer that overlie the source area and the drain area of the substrate and the sides of the first dielectric layer and the first metal layer may be left covered by the dielectric sidewall material. The dielectric sidewalls can mask these covered areas during subsequent ion implantation. The dielectric sidewalls can serve to increase the yield by reducing shorting between the first metal layer and the source contact or the drain contact, in some implementations. Block 108 is an optional operation, as indicated in FIG. 9, and in some implementations, block 108 may not be performed. A TFT device having no dielectric sidewalls can exhibit better performance characteristics, in some implementations, due its lower resistance.

Figure 10B:
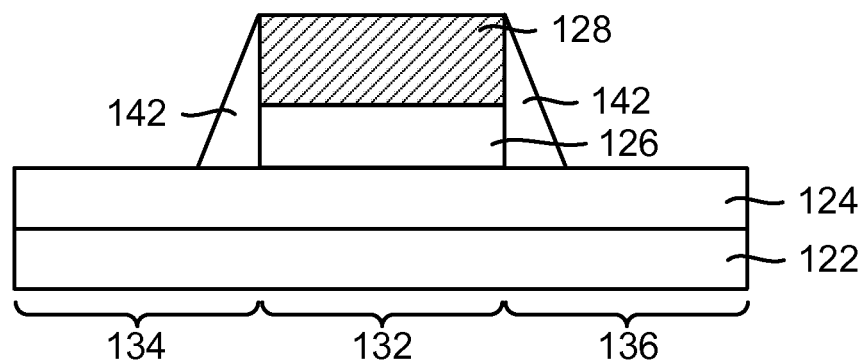

FIG. 10B shows an example of the TFT device at this point (e.g., up to the block 108) in the process 100. The TFT device includes dielectric sidewalls 142. As shown in the example of FIG. 10B, the dielectric sidewalls 142 are on either side of the first dielectric layer 126 and the first metal layer 128. The dielectric sidewalls 142 also cover a portion of the oxide semiconductor layer 124 overlying the source area 134 and the drain area 136 of the substrate; that is, one of the dielectric sidewalls 142 overlies a portion of the oxide semiconductor layer 124 that overlies the source area 134 of the substrate, with another of the dielectric sidewalls 142 overlying a portion of the oxide semiconductor layer 124 that overlies the drain area 136 of the substrate. While the dielectric sidewalls 142 in the example of FIG. 10C have sloped profiles, the dielectric sidewalls may have other profiles including vertically straight profiles.

Returning to FIG. 9, at block 110 metal cations are implanted in the oxide semiconductor layer overlying the source area and the drain area of the substrate to form heavily doped n-type oxide semiconductor layers. Examples of metal cations that may be implanted include cations of In, Ga, Zn, Hf, and Sn. In some implementations, metal cations of one of the constituent metals of the oxide semiconductor layer are implanted. For example, indium cations ($In^+$) may be implanted in InGaZnO, InZnO, InHfZnO, InSnZnO, InSnO and other In-containing oxide semiconductor layers. Gallium cations ($Ga^+$) may be implanted in InGaZnO, GaZnO, and other Ga-containing oxide semiconductor layers. Zinc cations ($Zn^+$) may be implanted in InGaZnO, InZnO, InHfZnO, InSnZnO, SnZnO, GaZnO, ZnO, and other Zn-containing oxide semiconductor layers. Hafnium cations ($Hf^+$) may be implanted in InHfZnO and other Hf-containing oxide semiconductor layers. Tin cations ($Sn^+$) may be implanted in InSnO, InSnZnO, SnZnO, and other Sn-containing layers. In some implementations, metal cations of multiple constituent metals of the oxide semiconductor layer can be implanted. For example, $In^+$ and $Sn^+$ can be implanted in an InSnZnO or InSnO layer.

Ion implantation can involve accelerating the metal cations toward the surface of the oxide semiconductor layer. The metal cations can be generated in an ion source, then delivered to a chamber that houses the substrate. Application of an electrical field accelerates the cations toward the substrate, where they are implanted into unmasked regions of the oxide semiconductor layer. In some implementations, the acceleration voltage can range from 1 keV to 200 keV. In some implementations, an implantation dose is about $10^{12}$ ions/cm$^2$ to $10^{20}$ ions/cm$^2$. Oxygen vacancies, also known as oxygen deficiencies, in an oxide semiconductor layer can become electron donors. A high density of electron donors results in a heavily doped n-type oxide semiconductor layer. Because metal cations can bind with oxygen molecules in the oxide semiconductor layer, the implantation of metal cations can induce a higher density of oxygen vacancies, resulting in a heavily doped n-type semiconductor layer.

Metal cations can be implanted throughout the thickness of the oxide semiconductor layer in some implementations. Implanting metal cations to a depth less than the thickness of the oxide semiconductor layer can result in high sheet resistance, while implanting metal cations to a depth greater than the thickness of the oxide semiconductor layer can result in damage to the substrate. The cation implantation depth in an oxide semiconductor TFT can be tightly controlled by controlling the acceleration voltage and cation energy, allowing for junction depth control and high ion concentrations in the source and drain areas.

Figure 10C:
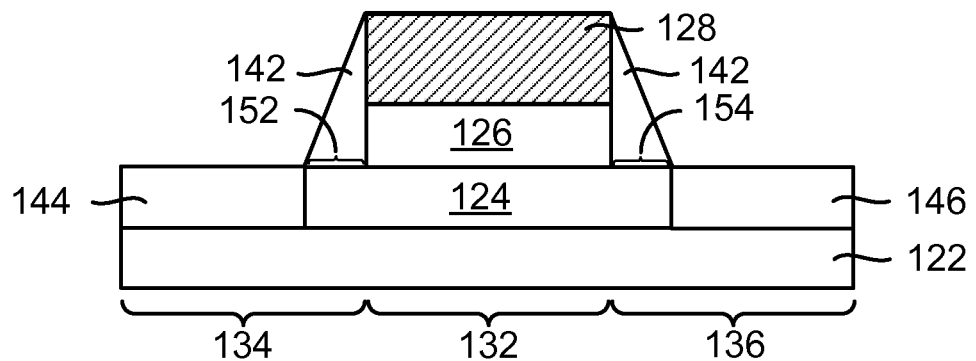

FIG. 10C shows an example of the TFT device up to the block 110 in the process 100 depicted in FIG. 9. The TFT device includes heavily doped n-type oxide semiconductor layers 144 and 146 overlying the source area 134 and the drain area 136 of the substrate 122. These heavily doped n-type oxide semiconductor layers 144 and 146 can form a source region and a drain region in the TFT device. The oxide semiconductor layer 124 not converted to a heavily doped n-type oxide semiconductor can form a channel region in the TFT device. Small regions 152 and 154 of the oxide semiconductor layer 124 on either side of the channel area 132 of the substrate underlie the dielectric sidewalls 142 and are not under the stack formed by the first dielectric layer 126 and the first metal layer 128. Because the regions 152 and 154 are masked by the dielectric sidewalls 142 during cation implantation, they are not part of heavily doped n-type oxide semiconductor layers 144 and 146. These regions 152 and 154 may limit diffusion into the oxide semiconductor layer overlying the channel area 132 of the substrate. These regions 152 and 154 also may increase the resistance of the TFT device. Note that in some implementations in which the dielectric sidewalls 142 are not present during cation implantation, the regions 152 and 154 may not be formed. In these implementations, the oxide semiconductor layer 124 not converted to a heavily n-doped semiconductor region may align substantially with the channel area 132 of the substrate 122 and the heavily doped n-type oxide semiconductors 144 and 146 may align substantially with the source and drain areas 134 and 136, respectively.

Returning to FIG. 9, at block 112, a second dielectric layer is formed on the first metal layer and the heavily doped n-type oxide semiconductor layers. The second dielectric layer may include any number of different dielectric materials. In some implementations, the second dielectric layer is the same dielectric material as the first dielectric layer, such as $SiO_2$, $Al_2O_3$, $HfO_2$, $TiO_2$, SiON, or SiN. The second dielectric layer may be formed using deposition processes, including PVD processes, CVD processes, and ALD processes. In some implementations, the second dielectric layer can be about 100 nm to 500 nm thick. In some implementations, the second dielectric layer acts as a passivation insulator. A passivation insulator can serve as a layer that protects the TFT device from the external environment. A passivation insulator also can provide insulation between the first metal layer and the source contact or the drain contact.

At block 114, a portion of the second dielectric layer is removed to expose the heavily doped n-type oxide semiconductor layers. The heavily doped n-type oxide semiconductor layer overlying the source area of the substrate and the heavily doped n-type oxide semiconductor layer overlying the drain area of the substrate may be exposed, for example. Photoresists with wet or dry etching processes may be used to expose the heavily doped n-type oxide semiconductor layers.

At block 116, contacts to the heavily doped n-type oxide semiconductor layers overlying the source area and the drain area of the substrate are formed. The contacts may include any number of different metals, such as Al, Cu, Mo, Ta, Cr, Nd, W, Ti, or an alloy containing any of these elements. In some implementations, the contacts include two or more different metals arranged in a stacked structure. The contacts also may include a conductive oxide, such as indium tin oxide (ITO). The contacts may be formed using deposition processes, including PVD processes, CVD processes, and ALD processes.

Figure 10D:
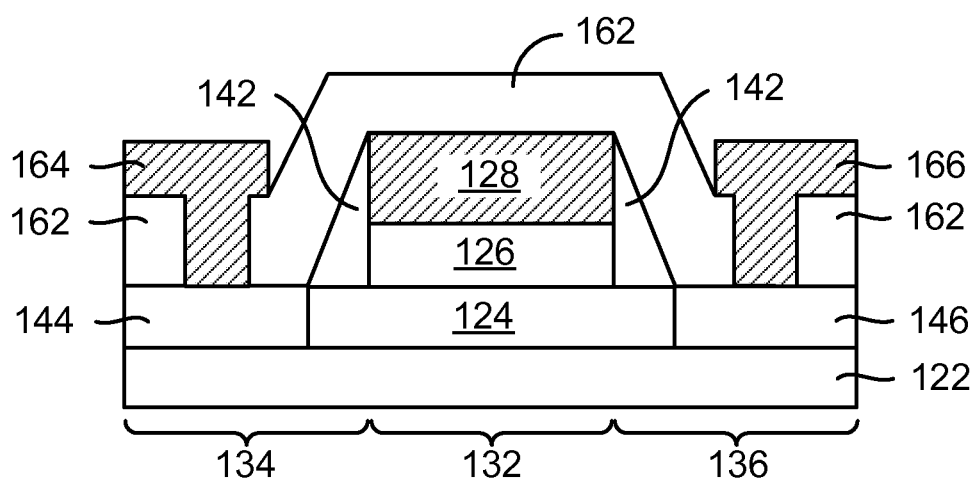

FIG. 10D shows an example of the fabricated TFT device (such as near or at the end of the process 100). The TFT device includes the substrate 122, the oxide semiconductor layer 124, the first dielectric layer 126, the first metal layer 128, the dielectric sidewalls 142, and the heavily doped n-type oxide semiconductor layers 144 and 146. The channel area 132 of the substrate is aligned with the first dielectric layer 126 and the first metal layer 128. The heavily doped n-type oxide semiconductor layers 144 and 146 overlie the source area 134 and the drain area 136 of the substrate, respectively. The TFT device further includes a second dielectric layer 162, a source contact 164, and a drain contact 166. In some implementations, the second dielectric layer 162 acts as a passivation insulator.

The TFT device in the examples of FIGS. 10A-10D may be a self-aligned TFT device. The term self-aligned refers to a gate stack (or other structure to which alignment of the heavily n-doped semiconductor oxide regions is desired) acting as a mask during cation implantation. In the examples of FIGS. 10A-10D, the first dielectric layer 126 and first metal layer 128, which may form a gate stack including a gate insulator and gate metal, act as a mask during cation implantation such that the source region and the drain region of a self-aligned TFT device are defined by the regions of the oxide semiconductor layer into which metal cations are implanted.

In some other implementations, a sacrificial mask may be used to define the source region, the channel region, and the drain region. For example, instead of depositing the first dielectric layer and the first metal layer in the blocks 104 and 106, a photoresist may be deposited on the oxide semiconductor layer overlying the channel area of the substrate. Then, metal cations may be implanted in the oxide semiconductor layer overlying the source area and the drain area of the substrate to form heavily doped n-type oxide semiconductor layers. After forming the heavily doped n-type oxide semiconductor layers, the photoresist mask may be removed and the first dielectric layer and a first metal layer may be formed on the oxide semiconductor layer overlying the channel area of the substrate. There may be misalignment in the photolithography processes defining the area on which the first dielectric layer and a first metal layer are formed, however. In implementations wherein the process 100 is self-aligned TFT device fabrication process, such misalignment is not an issue.

Figure 11:
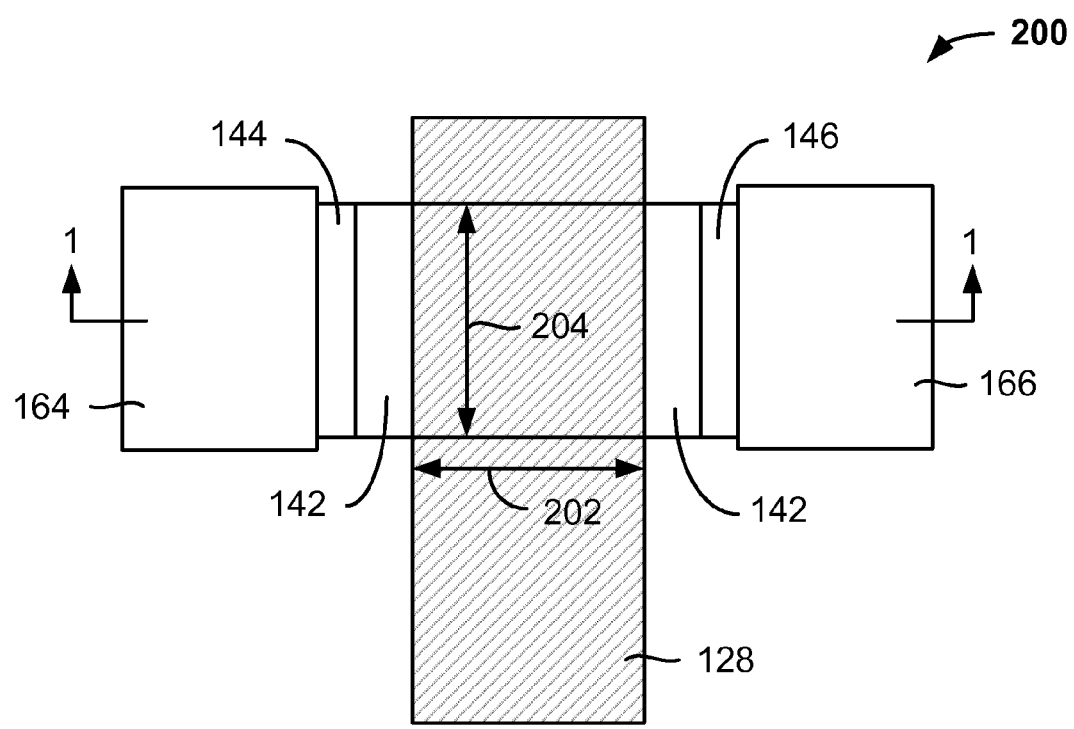
FIG. 11 shows an example of a top-down view of a TFT device.

FIG. 11 shows an example of a top-down view of a TFT device. The example of the fabricated TFT device shown in FIG. 10D is a cross-sectional schematic view of the TFT device through line 1-1 of FIG. 11. For the purposes of illustration, the top-down view of the TFT device 200 shown in FIG. 11 does not show the second dielectric layer 162 shown in FIG. 10D. Shown in FIG. 11 are the source contact 164, the heavily doped n-type oxide semiconductor layer 144, the heavily doped n-type oxide semiconductor layer 146, and the drain contact 166. Also shown are the dielectric sidewalls 142 and the first metal layer 128. A dimension 202 of the first metal layer 128 can be about 50 nm to a few tens of microns in some implementations. A dimension 204 of the TFT device 200 can be about 50 nm to a few millimeters, in some implementations.

Figure 12:
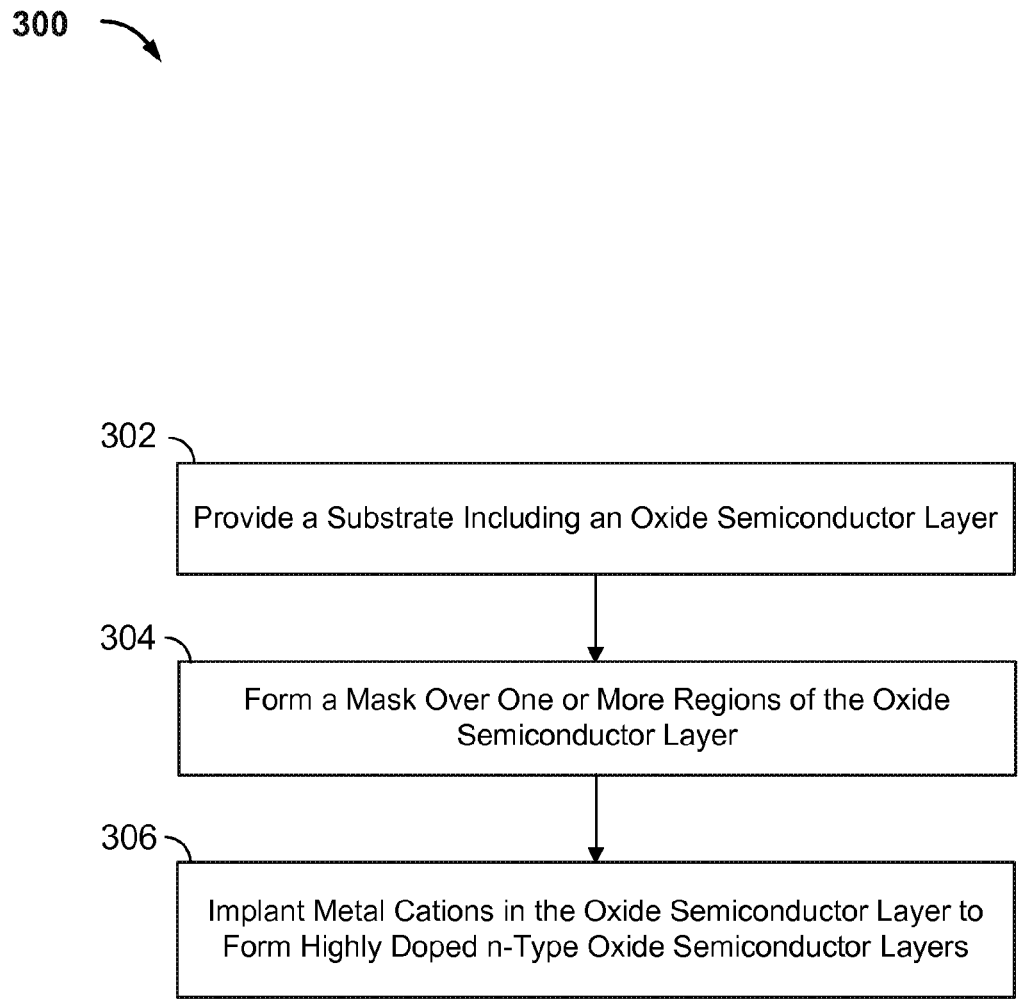
FIGS. 12 and 13 show examples of flow diagrams illustrating manufacturing processes for a TFT device.
Figure 13:
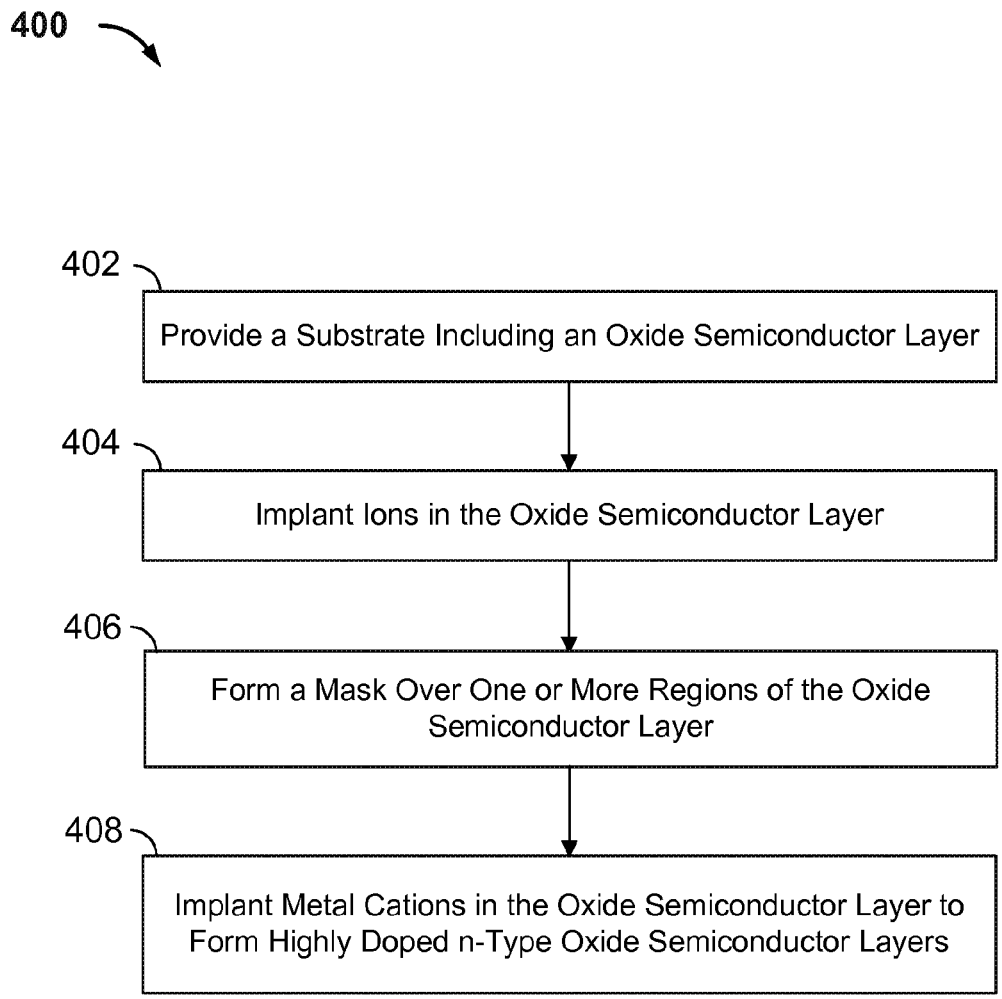

FIGS. 12 and 13 show examples of flow diagrams illustrating manufacturing processes for a TFT device. Some implementations of the process 300 shown in FIG. 12 can be similar to the process 100 shown in FIG. 9, with some process operations shown in FIG. 9 being condensed and/or omitted.

At block 302 of the process 300, a substrate is provided. The substrate can have a surface including a source area, a drain area, and a channel area. The channel area of the substrate is between the source area and the drain area of the substrate. The substrate may be any number of different substrate materials, as described above with reference to FIG. 9.

The substrate includes an oxide semiconductor layer on the surface of the substrate. Any oxide semiconductor layer including a constituent metal can be used, with examples including InGaZnO, InZnO, InHfZnO, InSnZnO, SnZnO, InSnO, GaZnO, and ZnO.

The process 300 continues at block 304 with formation of a mask over one or more regions of the oxide semiconductor layer. In some implementations, the mask is formed over a region than overlies the channel area of the substrate. The mask is a material effective to prevent cation implantation in the underlying one or more regions of the oxide semiconductor layer. In some implementations, the mask is a material having a density of at least 1 g/cm$^3$. Appropriate masks include metal, polymer and photoresist masks. In some implementations in which a top gate TFT is fabricated, the mask can be a gate structure. In some implementations, block 304 includes including deposition and patterning techniques.

The process 300 continues at block 306 with implantation of metal cations in the oxide semiconductor in the unmasked areas to form a heavily doped n-type oxide semiconductor layers. In some implementations, block 306 includes implanting metal cations in regions of the oxide semiconductor layer that overlie the source area and the drain area of the substrate. In some implementations, metal cations of one of the constituent metals of the oxide semiconductor layer are implanted. Examples of metal cations that may be implanted include cations of In, Ga, Zn, Hf and Sn.

To complete the fabrication of the TFT device, the process 300 may continue with various operations including formation of source and drain contacts, and if not already formed, a gate insulator and/or gate conductor. In some implementations, the mask formed in block 304 is removed after block 306. In some other implementations, for example if a gate stack or other part of the TFT device acts as a mask, the mask is left in place. Examples of further process operations that can be performed to complete fabrication of the TFT device are described above with respect to FIG. 9. For example, a second dielectric layer may be formed on the heavily doped n-type oxide semiconductor layers as described with respect to the block 112. A portion of the second dielectric layer may be removed to expose the heavily doped n-type oxide semiconductor layers as described with respect to the block 114. Contacts to the heavily doped n-type oxide semiconductor layers may be formed as described with respect to the block 116.

Turning to FIG. 13, implementations of the process 400 can be similar to implementations of the process 300 described in FIG. 12. In the process 400, ions are implanted in the oxide semiconductor layer prior to forming a mask over one or more regions of the oxide semiconductor layer. After implanting ions in the oxide semiconductor layer, implementations of the process 400 may proceed in a similar manner as in the process 300, as described above. The ions implanted in the oxide semiconductor layer may modulate the threshold voltage of the TFT device.

At block 402 of the process 400, a substrate is provided. The substrate may be any number of different substrate materials, including transparent materials, non-transparent materials, flexible materials, and rigid materials, as described above. The substrate may be of varying dimensions, as also described above. In some implementations, the substrate includes a source area, a channel area, and a drain area. In some implementations, a surface of the substrate on which the TFT device is fabricated includes a buffer layer, as described above.

At block 404, ions are implanted in the oxide semiconductor layer. In some implementations, the ions implanted in the oxide semiconductor layer are an n-type dopant. In some implementations, metal cations are implanted as described above. The metal cations can be cations of one of the constituent metals of the oxide semiconductor layer. In some other implementations, the ions may include hydrogen ions, oxygen ions, or other dopant. In some implementations, ions are implanted using a dose of at least about $10^{12}$ atoms/cm$^2$ or about $10^{12}$ to $10^{20}$ atoms/cm$^2$. Implanting ions in the oxide semiconductor layer can serve to modulate the threshold voltage of a fabricated TFT device, in some implementations. The threshold voltage of a TFT device is defined as the gate voltage at which an inversion layer forms at the interface of the gate insulator and the channel region of the TFT device. When a voltage is applied between the source and drain regions, the inversion layer allows for the flow of electrons between the source region and the drain region, through the channel region, of the TFT device. The threshold voltage is dependent on the carrier concentration in the channel region. Implanting ions in the oxide semiconductor layer can allow for the control of the carrier concentration in the oxide semiconductor layer such that the threshold voltage can be controlled. For example, when oxygen ions are implanted into the oxide semiconductor layer that will form the channel region of the TFT device, oxygen vacancies (or the carrier concentration) may be reduced (or depleted) such that a high gate voltage may be used to accumulate the carriers in the channel region, which may increase the threshold voltage. When metal cations are implanted into the oxide semiconductor layer that will form the channel region of the TFT device, the carrier concentration may be increased such that a low gate voltage may be used to accumulate the carriers in the channel region, which may decrease the threshold voltage.

The process 400 continues at block 406 with formation of a mask over one or more regions of the oxide semiconductor layer. In some implementations, the mask is formed over a region than overlies the channel area of the substrate. Appropriate masks are described above. The process 400 continues at block 408 with implantation of metal cations in the oxide semiconductor in the unmasked areas to form a heavily doped n-type oxide semiconductor layers. In some implementations, block 408 includes implanting metal cations in regions of the oxide semiconductor layer that overlie the source area and the drain area of the substrate. In some implementations, metal cations of one of the constituent metals of the oxide semiconductor layer are implanted. Examples of metal cations that may be implanted include cations of In, Ga, Zn, Hf, and Sn. The ions implanted in block 408 may be the same or different type of ions as implanted in block 404. In some implementations, the ion dose is greater in block 408 than in block 404. For example, the ion dose may be at least an order of magnitude greater in block 408 than in block 404.

To complete the fabrication of the TFT device, the process 400 may continue with various operations including formation of source and drain contacts, and if not already formed, a gate insulator and/or gate conductor. In some implementations, the mask formed in block 404 is removed after block 408. In some other implementations, for example if a gate stack or other part of the TFT device acts as a mask, the mask is left in place. Examples of further process operations that can be performed to complete fabrication of the TFT device are described above with respect to FIG. 9. For example, a second dielectric layer may be formed on the heavily doped n-type oxide semiconductor layers as described with respect to the block 112. A portion of the second dielectric layer may be removed to expose the heavily doped n-type oxide semiconductor layers as described with respect to the block 114.

Contacts to the heavily doped n-type oxide semiconductor layers may be formed as described with respect to the block 116.

Figure 14A:
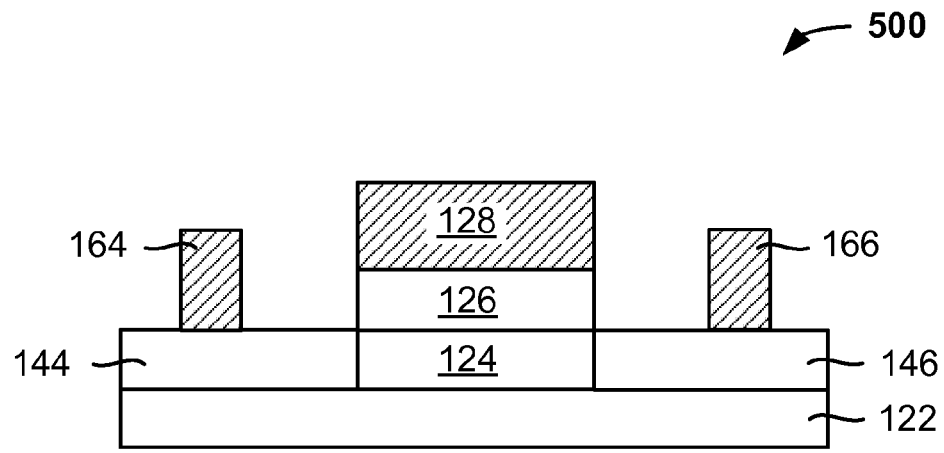
FIGS. 14A and 14B show an example of a cross-sectional schematic illustration of a TFT device.

FIG. 14A shows an example of a cross-sectional schematic illustration of a TFT device. The TFT device 500 shown in FIG. 14A may be fabricated with one of the processes 100, 300, or 400, for example. The TFT device 500 includes a substrate 122, an oxide semiconductor layer 124, and heavily doped n-type oxide semiconductor layers 144 and 146. A stack including a first dielectric layer 126 and a first metal layer 128 is disposed on the oxide semiconductor layer 124. Contacting the heavily doped n-type oxide semiconductor layers 144 and 146 are a source contact 164 and a drain contact 166, respectively. The oxide semiconductor layer 124, between the heavily doped n-type oxide semiconductor layers 144 and 146, can form the channel region of the TFT device 500. The heavily doped n-type oxide semiconductor layer 144 can form the source region of the TFT device 500, and the heavily doped n-type oxide semiconductor layer 146 can form the drain region of the TFT device 500.

Figure 14B:
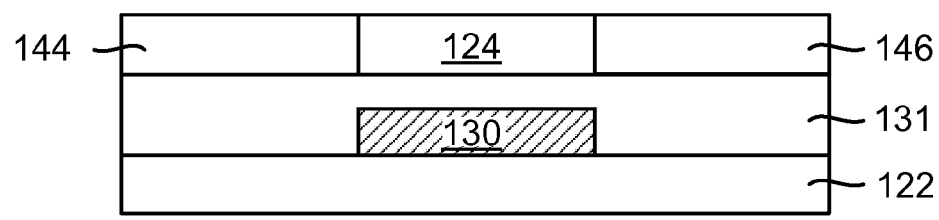

Many variations of the manufacturing processes for a TFT device illustrated in FIGS. 9, 13 and 14 may exist. For example, any of the processes described herein may be implemented with roll-to-roll processing methods with a flexible substrate. A large number of TFT devices may be made on a large substrate using roll-to-roll processing. In another example, the processes may be used to fabricate a TFT device including, in addition to or instead of a top gate, a bottom gate. FIG. 14B shows an example of a cross-sectional schematic illustration of a TFT device. The TFT device 600 shown in FIG. 14B may be fabricated with one of the processes 300 or 400, for example. The TFT device 600 includes a substrate 122, a bottom metal layer 130, a bottom dielectric layer 131, an oxide semiconductor layer 124, and heavily doped n-type oxide semiconductor layers 144 and 146. The bottom metal layer 130 can form a bottom gate of the TFT device 600 and the bottom dielectric layer 131 can form a gate insulator of the TFT device 600. The oxide semiconductor layer 124, between the heavily doped n-type oxide semiconductor layers 144 and 146, can form the channel region of the TFT device 600. The heavily doped n-type oxide semiconductor layer 144 can form the source region of the TFT device 600, and the heavily doped n-type oxide semiconductor layer 146 can form the drain region of the TFT device 600. In some implementations, the TFT device 600 can include source and drain contacts (not shown). As indicated, the TFT device 600 can be fabricated with the process 300, for example, with block 302 of the process 300 including providing a substrate including an oxide semiconductor layer overlying the bottom metal layer 130 and the bottom dielectric layer 131. In some implementations, the process can further include forming these layers prior to block 302. Blocks 304 and 306 can be performed as described above with respect to FIG. 12. In some implementations, the TFT device can further include a top gate (not shown).

Figure 15A:
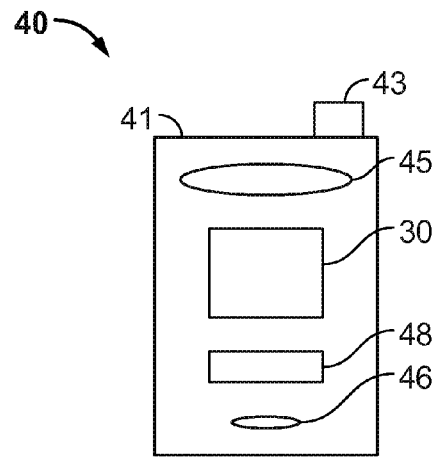
FIGS. 15A and 15B show examples of system block diagrams illustrating a display device that includes a plurality of IMODs.
Figure 15B:
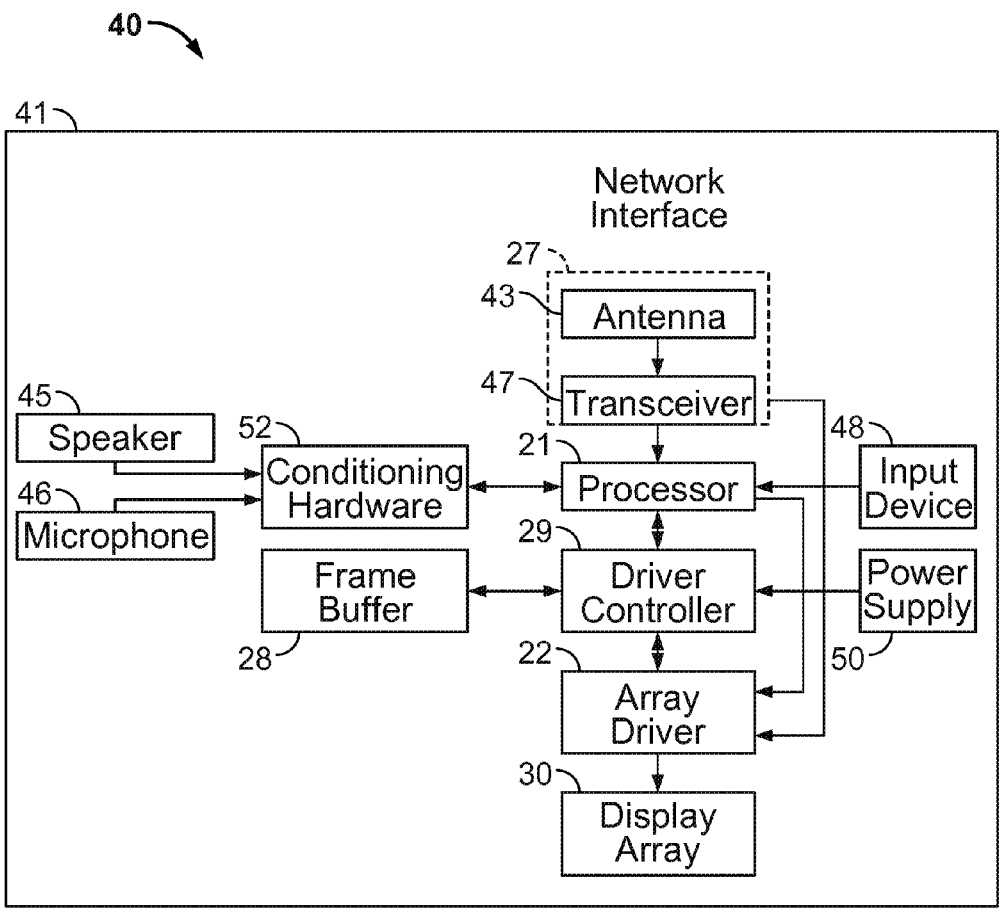

As indicated above, a TFT device may be part of hardware and data processing apparatus associated with a display device. FIGS. 15A and 15B show examples of system block diagrams illustrating a display device 40 that includes a plurality of IMODs. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 15B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43. In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An apparatus comprising:
   a substrate including a surface;
   an oxide semiconductor layer on the substrate surface, the oxide semiconductor layer including a channel region, a source region, and a drain region, the source region and the drain region of the oxide semiconductor layer being doped n-type oxide semiconductor layers implanted with metal cations to a concentration of greater than about $10^{19}$ atoms/cm$^3$, wherein the metal cation implantation depth is equal to the thickness of the oxide semiconductor layer;
   a first dielectric layer on the channel region of the oxide semiconductor layer; and
   a first metal layer on the first dielectric layer.

2. The apparatus of claim 1, wherein the metal cations are cations of a constituent metal of the oxide semiconductor layer.

3. The apparatus of claim 1, wherein the oxide semiconductor layer includes one or more of indium (In), gallium (Ga), zinc (Zn), hafnium (Hf), and tin (Sn).

4. The apparatus of claim 1, wherein the metal cations include one or more of indium cations (In+), gallium cations (Ga+), zinc cations (Zn+), hafnium cations (Hf+), and tin cations (Sn+).

5. The apparatus of claim 1, further comprising a first contact contacting the source region; and a second contact contacting the drain region.

6. The apparatus of claim 1, further comprising:
   a first dielectric sidewall on a first side of the first dielectric layer and on a first side of the first metal layer and a second dielectric sidewall on a second side of the first dielectric layer and on a second side of the first metal layer, the first dielectric sidewall and the second dielectric sidewall overlying portions of the channel region of the oxide semiconductor layer.

7. The apparatus of claim 1, further comprising:
   a second dielectric layer, wherein the second dielectric layer is on the first metal layer, the source region of the oxide semiconductor layer, and the drain region of the oxide semiconductor layer.

8. The apparatus of claim 1, wherein the substrate includes a glass substrate.

9. The apparatus of claim 1, further comprising:
   a display;
   a processor that is configured to communicate with the display, the processor being configured to process image data; and
   a memory device that is configured to communicate with the processor.

10. The apparatus of claim 9, further comprising:
    a driver circuit configured to send at least one signal to the display; and
    a controller configured to send at least a portion of the image data to the driver circuit.

11. The apparatus of claim 9, further comprising:
    an image source module configured to send the image data to the processor, wherein the image source module includes at least one of a receiver, transceiver, and transmitter.

12. The apparatus of claim 9, further comprising:
    an input device configured to receive input data and to communicate the input data to the processor.

13. The apparatus of claim 9, wherein the display is a liquid crystal display or an organic light-emitting diode display.

14. The apparatus of claim 1, wherein the metal cations include one or more of gallium cations (Ga+), zinc cations (Zn+), hafnium cations (Hf+), and tin cations (Sn+).

* * * * *